(12) United States Patent
Torrini et al.

(10) Patent No.: US 8,639,370 B2
(45) Date of Patent: Jan. 28, 2014

(54) AUDIO SOURCE SYSTEM AND METHOD

(75) Inventors: Antonio Torrini, Austin, TX (US);
Konstantin Shkolnyy, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 248 days.

(21) Appl. No.: 13/107,126

(22) Filed: May 13, 2011

(65) Prior Publication Data

US 2011/0213617 A1 Sep. 1, 2011

Related U.S. Application Data

(62) Division of application No. 11/335,804, filed on Jan. 19, 2006.

(51) Int. Cl.
*G06F 17/00* (2006.01)
*G06F 13/12* (2006.01)
*G06F 13/10* (2006.01)
*G06F 9/44* (2006.01)
*H04R 29/00* (2006.01)

(52) U.S. Cl.
USPC ........... 700/94; 703/21; 703/23; 703/24; 703/27; 710/19

(58) Field of Classification Search
USPC .......... 700/94; 703/21, 23, 24, 27; 710/18, 19
See application file for complete search history.

(56) References Cited

U.S. PATENT DOCUMENTS

| | | | |
|---|---|---|---|
| 5,625,845 A * | 4/1997 | Allran et al. ................ | 719/322 |
| 5,703,794 A | 12/1997 | Heddle et al. | |
| 6,138,183 A | 10/2000 | Tien et al. | |
| 6,353,172 B1 | 3/2002 | Fay et al. | |
| 2002/0098878 A1* | 7/2002 | Mooney et al. ............. | 455/569 |
| 2002/0196134 A1 | 12/2002 | Lutter et al. | |
| 2003/0179861 A1* | 9/2003 | Miyoshi et al. ............. | 379/68 |
| 2003/0191623 A1* | 10/2003 | Salmonsen ................ | 703/24 |
| 2005/0228628 A1 | 10/2005 | Bellantoni et al. | |
| 2006/0080679 A1 | 4/2006 | Parry | |

OTHER PUBLICATIONS

U.S. Appl. No. 11/335,804, Non-Final Office Action dated Oct. 27, 2010, (16 pgs).

* cited by examiner

*Primary Examiner* — Curtis Kuntz
*Assistant Examiner* — Thomas Maung
(74) *Attorney, Agent, or Firm* — Toler Law Group, PC

(57) ABSTRACT

A system includes a computer having a device driver. The device driver includes a detection module to detect an audio input. The device driver includes a selection module to send the audio input to audio hardware after detection of the audio input. The device driver also includes an emulation module to send hardware emulation information to an operating system audio application to replace feedback data received at the device driver from the audio hardware and sent from the device driver to the operating system audio application.

20 Claims, 3 Drawing Sheets

AUDIO SOURCE SYSTEM AND METHOD

CLAIM OF PRIORITY

This application is a divisional application of, and claims the benefit of, U.S. patent application Ser. No. 11/335,804, filed Jan. 19, 2006, the contents of which are expressly incorporated herein by reference in their entirety.

FIELD OF THE DISCLOSURE

The present disclosure relates to systems and methods for providing audio content to an audio hardware device.

BACKGROUND

Many computer applications have audio features. The audio features may include indicator sounds to inform a user of certain system events. Other audio features are more complex, such as playback of music files. In order to transmit an audio feature to a user, a computer application typically interacts with a device driver that controls audio hardware, such as a sound card. The audio hardware may provide the audio feature via an audio output device, such as a speaker.

In many computer environments, multiple computer applications can operate at the same time, and each application may include audio features to be provided to the audio hardware. Further, some audio features may have a higher priority than other features. For example, it may be important for a commercial audio computer application that no other audio features are provided to the audio hardware while the commercial audio computer application is operating. Such "audio interruptions" can lead to undesirable performance of the commercial audio computer application.

BRIEF DESCRIPTION OF THE DRAWINGS

The use of the same reference symbols in different drawings indicates similar or identical items.

DETAILED DESCRIPTION

In a particular embodiment, a system includes a detection module to detect a first audio input and a selection module to selectively provide the first audio input at an audio output to an audio device after the first audio input has been detected. The system also includes an emulation module to provide hardware emulation information corresponding to feedback data of the audio device after the first audio input has been detected.

In a particular embodiment, a method includes detecting a first audio data stream at a first audio input and switching from a second audio input to the first audio input after the first audio data stream has been detected. The method also includes providing hardware emulation information to an audio source of a second audio data stream.

Figure 1:
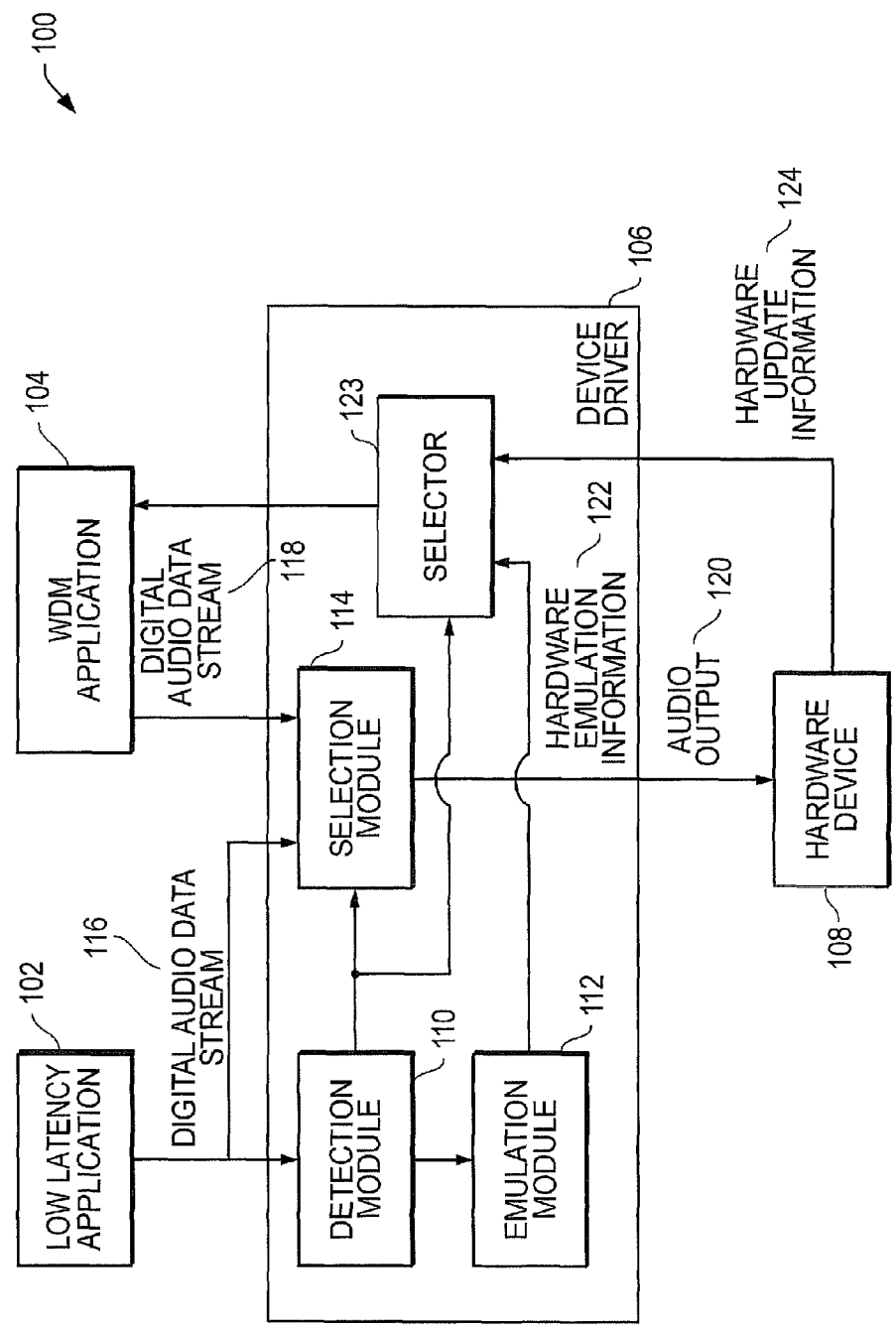
FIG. 1 is a block diagram of a particular embodiment of a system for providing an audio signal to an audio hardware device.

Referring to FIG. 1, a system 100 for providing an audio signal to an audio hardware device is illustrated. The system 100 includes a low latency application 102 and a Windows driver model (WDM) application 104. In a particular embodiment, the low latency application is an Audio Stream Input/Output (ASIO) application. The system 100 further includes a device driver 106 and a hardware device 108. The device driver 106 includes a detection module 110, an emulation module 112, a selection module 114, and a selector 123.

The hardware device 108 receives an audio output 120 from the device driver 106. The device driver 106 receives a digital audio data stream 116 from the low latency application 102. The device driver 106 also receives a digital audio data stream 118 from the WDM application 104. The selector 123 receives hardware update information 124 from the hardware device 108 and hardware emulation information 122 from the device driver 106, and selectively provides either the hardware update information 124 or the hardware emulation information 122 to the WDM application 104.

During operation, the WDM application 104 and the low latency application 102 may provide digital audio data streams to the device driver 106. The WDM application 104 may be any application including audio content that operates under a windows-based operating system. For example, the WDM application may be a software application that plays music, a game application, or other application that includes audio content. In a particular embodiment, the low latency application 102 is a professional audio application. In another particular embodiment, the WDM application 104 is a standard-latency application.

The device driver 106 selectively provides one of the received digital audio data streams at the audio output 120 to the hardware device 108. In addition, the device driver 106 selectively provides the hardware emulation information 122 or the hardware update information 124 to the WDM application 104 as appropriate to improve system stability.

In a first mode, the device driver 106 receives a digital audio data stream 118 from the WDM application 104. Further, in the first mode of operation, the low latency application 102 is not providing the digital audio data stream 116 to the device driver 106. In this first mode, the selection module 114 provides the digital audio data stream 118 as the audio output 120 to the hardware device 108.

Further, in the first mode the selector 123 provides hardware update information 124 received from the hardware device 108 to the WDM application 104. The hardware update information 124 can inform the WDM application 104 what portion of the digital audio data stream 118 has been output by the hardware device 108. This allows the WDM application 104 to properly synchronize the digital audio data stream 118 with the hardware device 108. For example, the WDM application 104 may adjust the transmission speed of the digital audio data stream 118 to synchronize with the hardware device 108. Failure to properly synchronize the digital audio data stream 118 and the hardware device 108 can lead to system instability or poor system performance. For example, if the digital audio data stream 118 is provided to the hardware device 108 more quickly than the device 108 can process the stream, the audio output of the device may be incorrect or include errors. If the digital audio data stream 118 is not provided to the hardware device 108 at a fast enough rate, the audio output may include undesirable pauses, noise, or periods of silence. Further, the WDM application 104 may be programmed to expect hardware update information, and if the application does not receive the expected update information, or receives incorrect information, the WDM application 104 may cease to work properly, or cease operation altogether. This may be particularly serious if the WDM application 104 is a system application. Improper operation of a system application can result in instability or errors of the entire operating system.

In order to synchronize the digital audio data stream 118 and the hardware device 108, the hardware update information 124 may include audio stream location information. For example, the hardware update information 124 may include pointer information indicating which portion or data location of the digital audio data stream 118 has been output by the hardware device 108. In a particular embodiment, the hardware update information 124 may include direct memory access (DMA) pointer information. The pointer information may change over time to indicate the latest portion of the digital audio data stream 118 that has been output by the hardware device 108. The rate at which the pointer information changes may depend on a variety of factors, including the sample rate and bit depth of the digital audio data stream 118.

When the low latency application 102 provides the digital audio data stream 116 to the device driver 106, the system 100 may enter a second mode of operation. In this second mode of operation the detection module 110 detects the presence of the digital audio data stream 116 and applies a control signal to the selection module 114 and the selector 123. In response to this control signal, the selection module 114 applies the digital audio data stream 116 at the audio output 120. The hardware device 108 thereby receives the digital audio data stream 116 instead of the digital audio data stream 118.

In the second mode of operation, the WDM application 104 continues to provide the digital audio data stream 118 to the device driver 106. As explained above, it may be important for system stability for the WDM application to synchronize the digital audio data stream 118 with the hardware device 108. Accordingly, the detection module 110 applies a control signal to the emulation module 112 to activate emulation. The emulation module 112, in response, provides the hardware emulation information 122 to the selector 123. In addition, the selector 123 may provide the hardware emulation information to the WDM application 104 in response to the control signal provided by the detection module 110.

The hardware emulation information 122 may emulate the hardware update information 124. For example, the hardware emulation information 122 may include audio stream location information similar to the audio stream location information provided by the hardware update information 124. The hardware emulation information 122 may provide updated audio stream location information that is similar to the audio stream location information that would be provided by the hardware update information 124 if the hardware device 108 was still receiving audio content from the WDM application 104. For example, the emulator 112 may include information associated with the hardware update information, such as pointer location information, as well as the bit depth, sample rate and number of channels associated with the digital audio data stream 118. Based on this information, the emulator 112 may provide emulated pointer information to the WDM application 104 via the hardware emulation information 122. Thus, the WDM application 104 continues to receive hardware update information while the low latency application 102 is providing the digital audio data stream 116 to the hardware device 120. This can improve the stability of the WDM application 104, as well as overall system stability.

The device driver 106 may perform additional functions to provide an appropriate transition between the digital audio data stream 118 and the digital audio data stream 116. For example, in a particular embodiment, the device driver 118 may perform a fade-out operation on the digital audio data stream 118 prior to switching to the digital audio data stream 116. This can reduce undesirable noise artifacts due to the switch in audio data streams. The digital audio data stream 116 can be buffered while the fade-out operation is performed to ensure that data is not lost. In another particular embodiment, the device driver 118 may perform a fade-in operation on the digital audio data stream 116 after switching to that stream. This may also reduce unwanted noise artifacts. In yet another particular embodiment, the parameters of the device driver 106 may be set by a user to control whether the fade-in or fade out operations are performed.

When the low latency application 102 stops providing the digital audio data stream 116, the selection module 114 applies the digital audio data stream 118, instead of the digital audio data stream 116, at the audio output 120. Further, the emulation module 112 stops providing the hardware emulation information 122 to the WDM application 104 and the hardware device 108 then provides hardware update information 124. Because the emulation module 112 has provided the hardware emulation information 122 to the WDM application 104 while the digital audio data stream 116 was being played, the likelihood of a system crash or other system problem resulting from a change in the audio output 120 is reduced.

Figure 2:
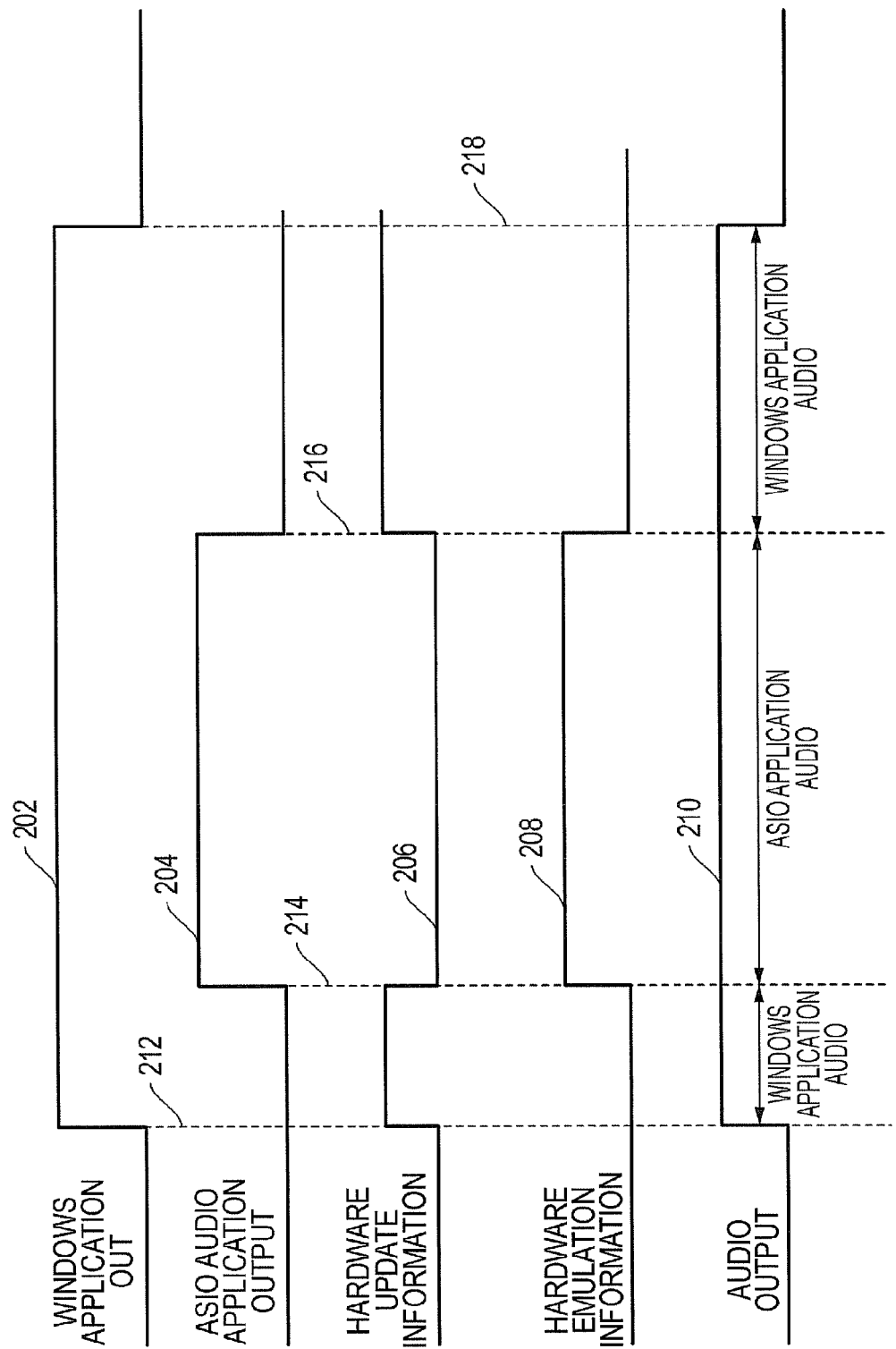
FIG. 2 is a timing diagram of a particular embodiment of a series of signals associated with the system of FIG. 1.

Referring to FIG. 2, a timing diagram of a series of system signals, such as the signals of the system 100 of FIG. 1, is illustrated. The signals include a WDM application output signal 202, an ASIO audio application output 204, hardware update information signal 206, hardware emulation information signal 208, and audio output 210.

As illustrated, at a first time 212 the WDM application output is activated. This may represent the activation of a digital audio data stream, such as the digital audio data stream 118 of FIG. 1. After application of the WDM application output at time 212, the audio output 210 receives the WDM application audio. In addition, at time 212, the hardware update information signal 206 is activated, as the hardware device that receives the audio output begins providing hardware update information to the WDM application. The WDM application may use this hardware update information to synchronize the digital audio data stream with the hardware device.

At a second time 214, the ASIO audio application output signal 204 is activated. In response the hardware update information signal 206 is deactivated. The hardware update information signal 206 may be deactivated because any information provided by the hardware device will be associated with the low latency application, rather than the WDM application. Accordingly, the WDM application cannot rely on the hardware update information to properly synchronize its digital audio data stream with the hardware device. Therefore, at time 214, the hardware emulation information 208 is activated to so that the WDM application associated with the WDM application output 202 continues to receive hardware update information, thereby improving the stability of the overall system.

After the second time 214, the audio output 210 applies the low latency application audio. At a third time 216 the ASIO audio application output is deactivated. In response, the hardware emulation information signal 208 is deactivated and the hardware update information signal 206 is re-activated. The audio output 210 then resumes providing the WDM application audio. At a fourth time 218, the WDM application output 202 is deactivated and in response the audio output 210 is also deactivated.

Figure 3:
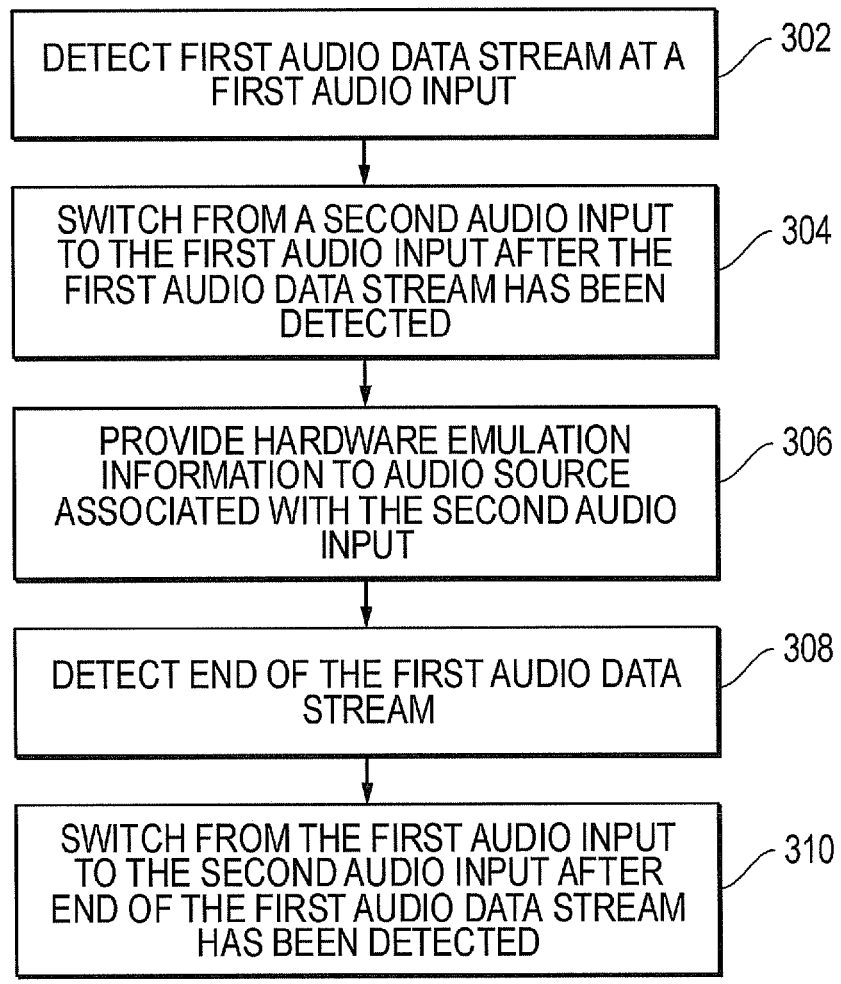
FIG. 3 is a flow chart of a method of providing a digital audio signal to an audio hardware device.

Referring to FIG. 3, a method of providing a digital audio signal is illustrated. At step 302, a first audio data stream is detected at a first audio input. The first audio data stream may be received from a low latency application at an audio input to a device driver. Proceeding to step 304, the system switches from a second audio input (e.g. a previously played Windows audio stream) to the first audio input after the first audio data stream has been detected. The system may switch from the second audio input to the first audio input by selectively applying the first audio input at an audio output of the system. In a particular embodiment, prior to switching to the first audio input, a fade-out operation is performed on a second audio data stream provided to the second audio input. In another particular embodiment, a fade-in operation is performed on the first audio data stream after switching to the first audio input. The fade-out and fade-in operations may be performed by a device driver.

Proceeding to step 306, hardware emulation information is provided to an audio source of the second audio data stream provided to the second audio input. By providing the hardware emulation information to the audio source, the overall stability of the system may be improved. For example, many WDM applications require continuous hardware updates to correspond with the application processes. These hardware updates may not be available while the associated hardware is engaged with processing the first audio input. Accordingly, the hardware emulation information can emulate the appropriate hardware updates for the WDM application, improving the stability of the application and the overall system. In a particular embodiment, the hardware emulation information includes information based on a direct memory access (DMA) pointer. In another particular embodiment, the audio stream location information is based on a bit depth, sample rate, or number of data channels associated with the second audio data stream.

Proceeding to step 308, an end of the first audio data stream is detected. This end may be detected by according to a standard framework associated with the device driver 106. Moving to step 310, the audio output is switched from the first audio input to the second audio input after the end of the first audio data stream has been detected.

The above disclosed subject matter is to be considered illustrative, and not restrictive, and the appended claims are intended to cover all such modifications, enhancements, and other embodiments which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A system comprising:
  a computer having a device driver, wherein the device driver includes:
    a detection module to detect an audio input;
    a selection module to send the audio input to audio hardware after detection of the audio input; and
    an emulation module to send hardware emulation information to an operating system audio application to replace feedback data, the feedback data received at the device driver from the audio hardware and sent from the device driver to the operating system audio application, in response to an audio stream from the operating system audio application, wherein the audio stream is sent to the audio hardware before the audio input is sent to the audio hardware, and wherein the hardware emulation information simulates synchronization between the operating system audio application and the audio hardware.

2. The system of claim 1, further comprising the audio hardware, wherein the audio hardware comprises a sound card.

3. The system of claim 2, further comprising at least one speaker coupled to the sound card.

4. The system of claim 1, wherein the selection module sends a second audio input to the audio hardware before the audio input has been detected.

5. The system of claim 4, wherein the audio input is received from a first audio application and the second audio input is received from the operating system audio application, and wherein a first latency associated with the first audio application is lower than a second latency associated with the operating system audio application.

6. The system of claim 4, wherein the selection module selectively sends the second audio input to the audio hardware after an end of the audio input has been detected.

7. The system of claim 1, wherein the operating system audio application is an audio stream input/output application.

8. The system of claim 1, wherein the device driver includes a selector module to send the feedback data received via the audio hardware to the operating system audio application before detection of the audio input and to send the hardware emulation information received via the emulation module to the operating system audio application after detection of the audio input.

9. A non-transitory computer readable media comprising computer instructions, the computer instructions executable by a computer to:
  detect an audio input received from an application driver;
  send the audio input to an audio device after detection of the audio input; and
  send hardware emulation information to an operating system audio application, wherein the hardware emulation information replaces feedback data from the audio device, the feedback data received in response to an audio stream from the operating system audio application sent to the audio device before the audio input is sent to the audio device, and wherein the hardware emulation information simulates synchronization between the operating system audio application and the audio device.

10. The non-transitory computer readable media of claim 9, further comprising computer instructions executable by the computer to perform a fade-in operation of the audio input when the audio input is sent to the audio device.

11. The non-transitory computer readable media of claim 9, further comprising computer instructions executable by the computer to perform a fade-out operation of the audio stream when the audio input is sent to the audio device.

12. The non-transitory computer readable media of claim 9, further comprising computer instructions executable by the computer to buffer the audio input before the audio input is sent to the audio device.

13. The non-transitory computer readable media of claim 9, wherein the hardware emulation information includes audio stream location information associated with the audio stream.

14. The non-transitory computer readable media of claim 13, wherein the audio stream location information includes a direct memory access pointer.

15. The non-transitory computer readable media of claim 13, wherein the audio stream location information is based on a bit depth associated with the audio stream.

16. The non-transitory computer readable media of claim 13, wherein the audio stream location information is based on a sample rate associated with the audio stream.

17. The non-transitory computer readable media of claim 13, wherein the audio stream location information is based on a number of audio channels associated with the audio stream.

18. A method comprising:
  sending feedback data received at a device driver of a computer to an operating system audio application, wherein the feedback data is received by the device driver in response to the device driver sending an audio stream to audio hardware;

detecting an audio input at the device driver of the computer;

sending the audio input to the audio hardware from the device driver after detection of the audio input to replace the audio stream; and sending hardware emulation information generated by the device driver to the operating system audio application to replace the feedback data after the audio input is sent to the audio hardware, wherein the hardware emulation information simulates synchronization between the operating system audio application and the audio hardware.

19. The method of claim 18, wherein the audio stream is sent to the device driver by an audio stream input/output source.

20. The method of claim 18, wherein the audio input is sent to the device driver by an application driver source.

* * * * *